(12) United States Patent
Jensen et al.

(10) Patent No.: US 7,940,142 B2
(45) Date of Patent: May 10, 2011

(54) TWO-POINT MODULATION POLAR TRANSMITTER ARCHITECTURE AND METHOD FOR PERFORMANCE ENHANCEMENT

(75) Inventors: Henrik T. Jensen, Long Beach, CA (US); Brima B. Ibrahim, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/506,997

(22) Filed: Jul. 21, 2009

(65) Prior Publication Data

US 2009/0278613 A1    Nov. 12, 2009

Related U.S. Application Data

(63) Continuation of application No. 11/471,147, filed on Jun. 20, 2006, now Pat. No. 7,579,922.

(51) Int. Cl.
*H03C 3/20* (2006.01)
*H03C 3/06* (2006.01)
(52) U.S. Cl. .......................... 332/128; 332/120; 455/102
(58) Field of Classification Search .................. 332/119, 332/120, 127, 128; 455/102
See application file for complete search history.

(56) References Cited

U.S. PATENT DOCUMENTS

| | | | | |
|---|---|---|---|---|
| 6,700,447 | B1 * | 3/2004 | Nilsson | 331/10 |
| 7,015,738 | B1 * | 3/2006 | Cao | 327/159 |
| 7,183,860 | B2 * | 2/2007 | Staszewski et al. | 331/1 A |

* cited by examiner

*Primary Examiner* — Robert Pascal
*Assistant Examiner* — James E Goodley
(74) *Attorney, Agent, or Firm* — Garlick Harrison & Markison; Holly L. Rudnick (57) ABSTRACT

A polar transmitter includes a two-point modulation phase-locked loop (PLL) for producing an RF signal with a wide bandwidth. The PLL includes a first input for receiving a phase signal of a variable-envelope modulated signal and providing the phase signal along a first signal path to produce a first frequency modulation signal and a second input for receiving the phase signal and providing the phase signal along a second signal path to produce a second frequency modulation signal. The PLL further includes a voltage controlled oscillator (VCO) having two modulation points, one for receiving the first frequency modulation signal and the other for receiving the second frequency modulation signal. The VCO is controlled by an aggregate of the first frequency modulation signal and the second frequency modulation signal to up-convert the phase signal from an IF to an RF to produce the RF signal with a wide bandwidth.

12 Claims, 11 Drawing Sheets

TWO-POINT MODULATION POLAR TRANSMITTER ARCHITECTURE AND METHOD FOR PERFORMANCE ENHANCEMENT

CROSS-REFERENCE TO RELATED APPLICATIONS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. application Ser. No. 11/471,147, entitled "Two-Point Modulation Polar Transmitter Architecture and Method for Performance Enhancement,", filed Jun. 20, 2006, pending.

BACKGROUND

1. Technical Field

The present invention relates to wireless communications and, more particularly, wideband wireless communication systems.

2. Related Art

Modern wireless RF transmitters for applications, such as cellular, personal, and satellite communications, employ digital modulation schemes such as frequency shift keying (FSK) and phase shift keying (PSK), and variants thereof, often in combination with code division multiple access (CDMA) communication. Independent of the particular communications scheme employed, the RF transmitter output signal, $s_{RF}(t)$, can be represented mathematically as $$s_{RF}(t)=r(t)\cos(2\pi f_c t+\theta(t)) \quad (1)$$

where $f_c$ denotes the RF carrier frequency, and the signal components $r(t)$ and $\theta(t)$ are referred to as the envelope and phase of $s_{RF}(t)$, respectively.

Some of the above mentioned communication schemes have constant envelope, i.e., $$r(t)=R,$$

and these are thus referred to as constant-envelope communications schemes. In these communications schemes, $\theta(t)$ constitutes all of the information bearing part of the transmitted signal. Other communications schemes have envelopes that vary with time and these are thus referred to as variable-envelope communications schemes. In these communications schemes, both $r(t)$ and $\theta(t)$ constitute information bearing parts of the transmitted signal.

The most widespread communication standard in the area of wireless personal area networks (PANs) is currently Bluetooth. This communication standard employs Gaussian minimum shift keying (GMSK), which is a constant-envelope binary frequency shift keying (FSK) modulation scheme allowing raw transmission at a maximum rate of 1 Megabits per second (Mbps). While standard Bluetooth is sufficient for voice services, future high-fidelity audio and data services demand higher data throughput rates. Higher data rates can be achieved in the specification of the Bluetooth Enhanced Data Rates (Bluetooth EDR) standard by selectively applying a variable-envelope 4-level or 8-level phase shift keying (PSK) modulation scheme. With these variable-envelope communication scheme options, the maximum bit rate is increased 4-fold or 8-fold, respectively, compared to standard Bluetooth, while the chosen pulse shaping, a square-root raised cosine filter with a roll-off factor of 0.4, ensures that the RF carrier bandwidth is the same as that of standard Bluetooth, allowing for the reuse of the RF frequency channels.

A transmitter appropriate for a variable-envelope modulation scheme in the Bluetooth EDR standard is a polar transmitter. In a polar transmitter, digital baseband data enters a digital processor that performs the necessary pulse shaping and modulation to some intermediate frequency (IF) carrier $f_{IF}$ to generate digital envelope (amplitude-modulated) and digital phase-modulated signals. The digital amplitude-modulated signal is input to a digital-to-analog converter (DAC), followed by a low pass filter (LPF), along an amplitude path, and the digital phase-modulated signal is input to another DAC, followed by another LPF, along a phase path. The output of the LPF on the amplitude path is an analog amplitude signal, while the output of the LPF on the phase path is an analog phase signal. The analog phase signal is input to a phase-locked loop (PLL) to enable the phase of the RF output signal to track the phase of the analog phase signal. The RF output signal is modulated in a non-linear power amplifier (PA) by the analog amplitude signal. Thus, in polar transmitter architectures, the phase component of the RF signal is amplified through the non-linear PA while the amplitude modulation is performed at the output of the PA.

To produce the appropriate RF output frequency, various frequency synthesis methods can be employed in the polar transmitter PLL. One frequency synthesis method commonly used in polar transmitter PLLs is the fractional-N PLL frequency synthesis method. Typical architectures for such PLL frequency synthesizers include so-called "fractional-N" PLLs. In this type of PLL, single oscillator is caused to produce the specified output frequency required for an outgoing radio frequency transmission by dividing its oscillation frequency by a number, N, and comparing that to an accurate known reference frequency. When in lock, the PLL oscillator will oscillate at a frequency equal to N times the reference frequency. The dividend, however, often is not a whole number, and thus the term "Fractional-N" refers to a non-integer dividend that is used in a PLL to produce the desired output frequency. Such non-integer values may effectively be arrived at by interpolation between multiple integer dividends in such a fashion that the average dividend equals the desired non-integer dividend. Typically, a delta sigma modulator is used to perform the interpolation by appropriately choosing the integer dividends to produce the desired non-integer dividend. The "penalty" associated with this interpolation process is phase noise of the PLL output introduced by the delta sigma modulator.

The popularity of traditional fractional-N PLL frequency synthesizers stems from their ability to synthesize frequencies with, in principle, arbitrary precision. However, a limitation of fractional-N frequency synthesizers is their relatively narrowband nature due to the necessity of attenuating the phase noise introduced by the delta sigma modulator interpolation process. Typically, the bandwidth of the PLL is limited to the 150 kHz-200 kHz range for wireless applications such as the Bluetooth EDR standard. However, for Bluetooth EDR, the required signal bandwidth is much wider, on the order of one MHz. As a result, it is not feasible to design a polar transmitter based upon a fractional-N PLL with the conventional narrow bandwidth. Therefore, what is needed is a polar transmitter architecture capable of providing wideband modulation in the phase path while maintaining high accuracy in the final modulated output signal.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
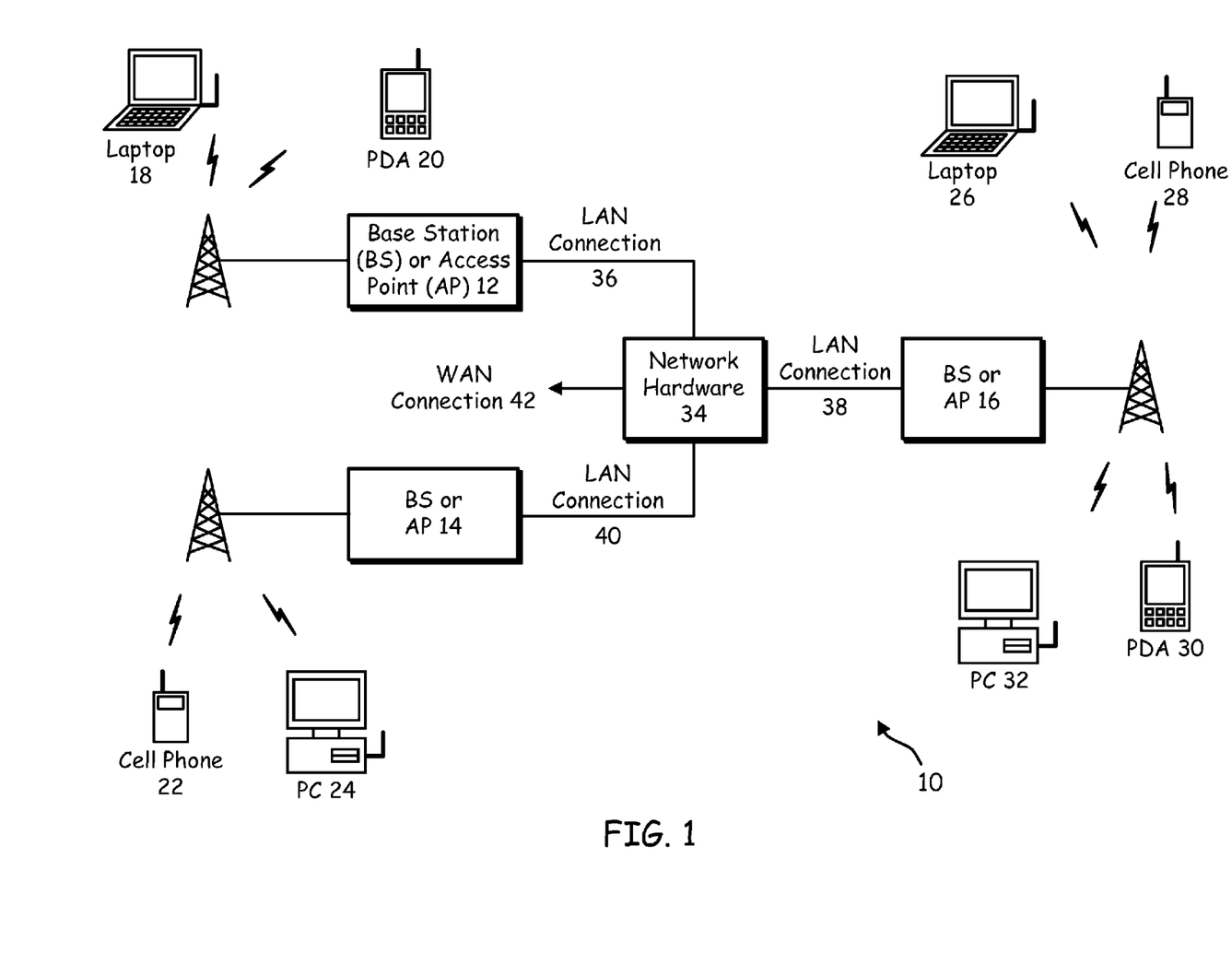
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail below with reference to FIGS. 2-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. For example, access points are typically used in Bluetooth systems. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
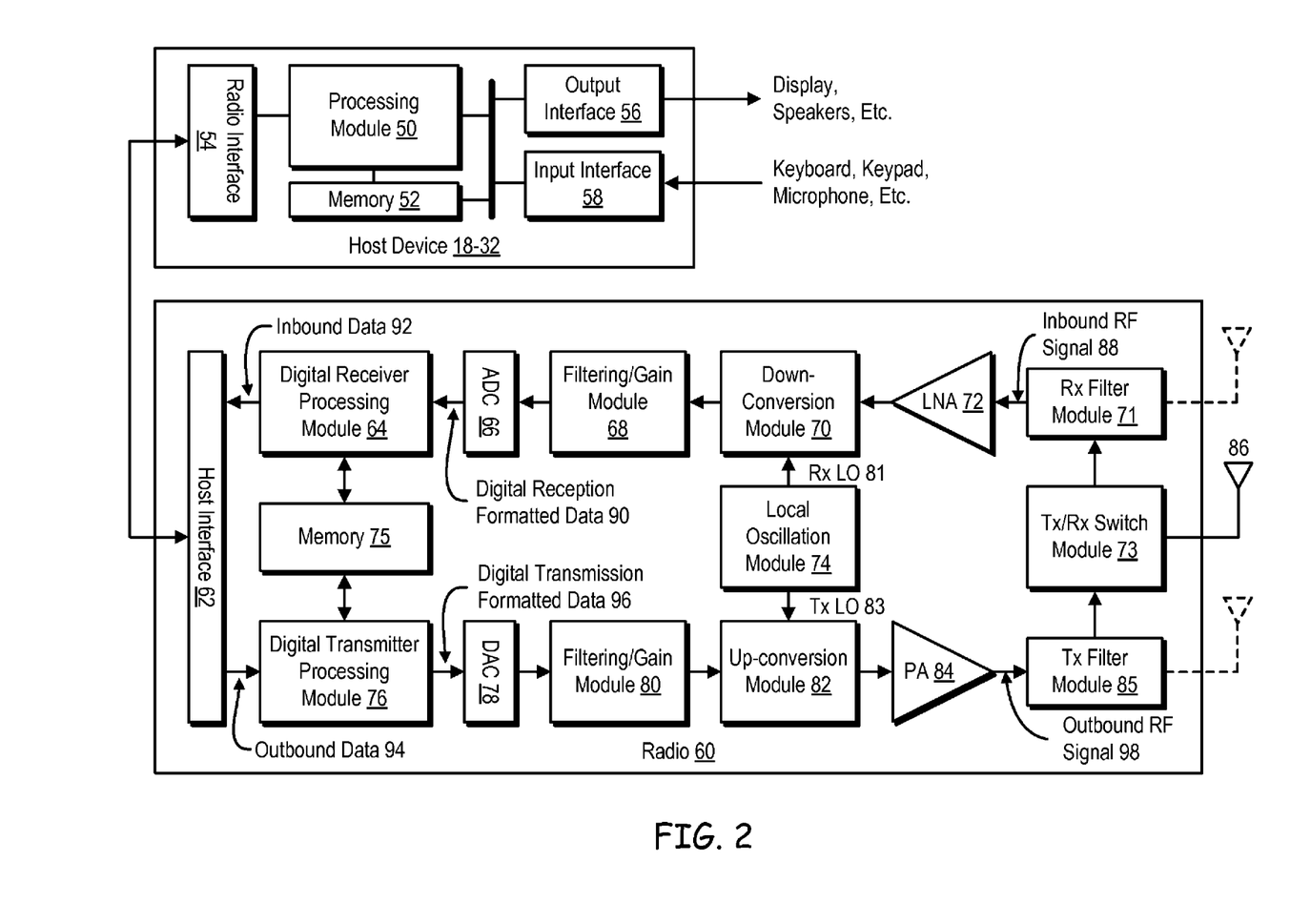
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device, such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (TX/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the TX/RX switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation.

The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., GSM, EDGE, WCDMA, Bluetooth EDR, etc.) to produce digital transmission formatted data 96. The digital transmission formatted data 96 is a digital baseband signal or a digital low IF signal, where the low IF typically will be in the frequency range of 100 KHz to a few Megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the TX/RX switch module 73, where the RX filter module 71 bandpass filters the inbound RF signal 88. The RX filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68. The filtering/gain module 68 filters and/or attenuates the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of host device 18-32 and the digital receiver processing module 64 and the digital transmitter processing module 76 of radio 60 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

Figure 3:
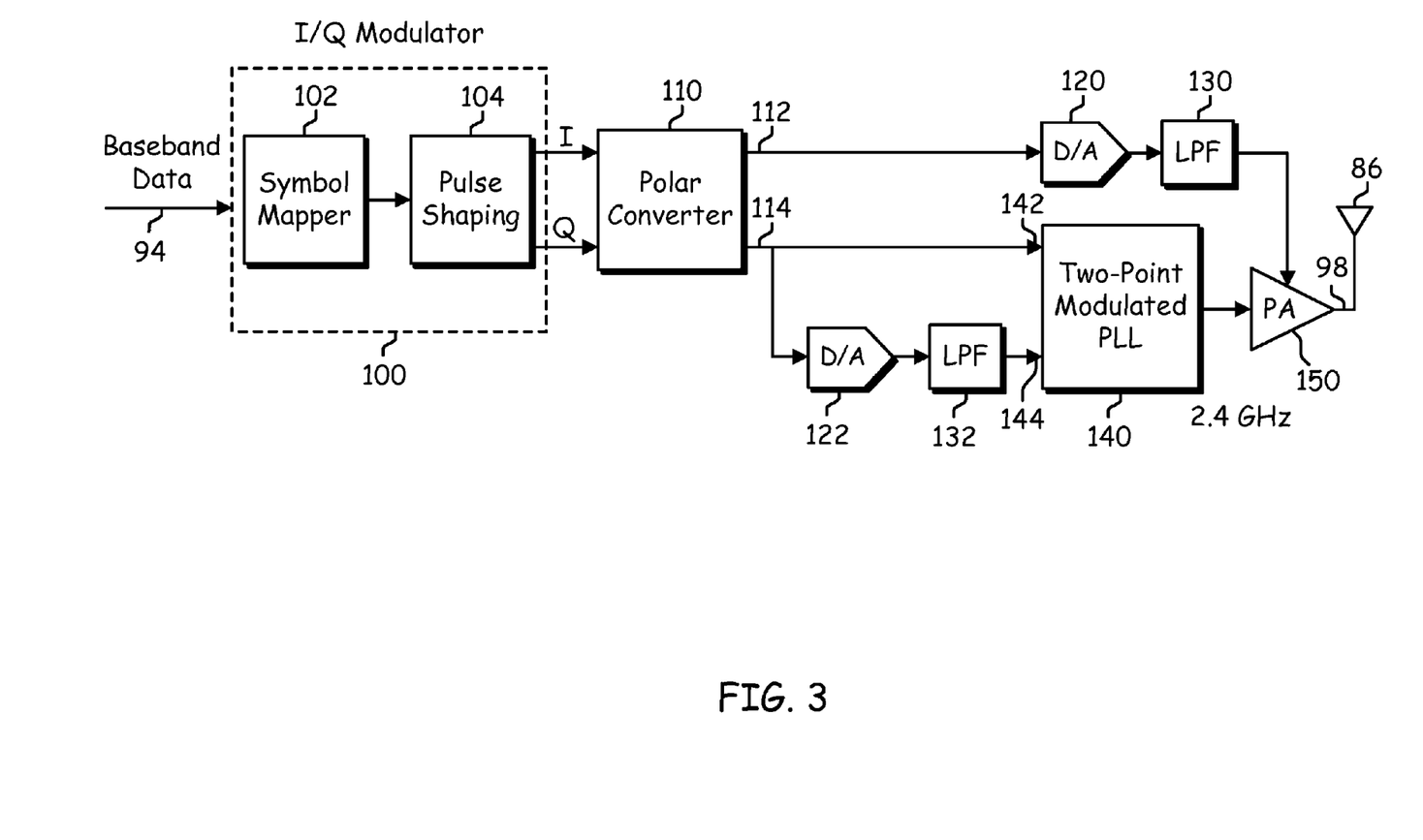
FIG. 3 is a schematic block diagram of an exemplary polar RF transmitter, in accordance with embodiments of the present invention.

FIG. 3 is a schematic block diagram of an exemplary polar RF transmitter architecture capable of producing wideband RF output signals in accordance with embodiments of the present invention. The polar RF transmitter architecture shown FIG. 3 is functionally equivalent to blocks 76, 78, 80, 82, 84 and 86 of FIG. 2. One typical application of the RF polar transmitter of FIG. 3 is Bluetooth EDR for Personal Area Networking (PAN), though the concepts may readily be applied to other types of communication networks. In FIG. 3, it is assumed that a baseband processor delivers baseband data 94 to the RF polar transmitter for further processing and RF transmission.

The transmitter includes an I/Q digital modulator 100 that performs the necessary pulse shaping, modulation, and interpolation filtering on the baseband data 94 to produce in-phase (I) and quadrature (Q) signals, followed by a polar converter 110 that converts the in-phase and quadrature digital signals from cartesian to polar form to produce an envelope (amplitude) signal 112 and a phase signal 114. The cartesian digital modulator 100 includes a symbol mapper 102 and a pulse shaping block 104. The symbol mapper 102 maps incoming data bits in the baseband data 94 to a stream of digital symbols (e.g., PSK digital symbols), and the pulse shaping block 104 performs narrowband pulse shaping filtering on the digital symbols to produce the I and Q signals. The process of pulse shaping ensures that the transmitted RF signal is sufficiently band limited so as to not interfere excessively with adjacent RF channels. For example, the pulse shaping block 140 may include a square-root raised cosine (RRC) filter with a roll-off factor of 0.4. The polar converter 110 converts the PSK in-phase and quadrature components produced by pulse shaping block 104 to a phase or frequency component, θ, represented by phase signal 114 and a magnitude (envelope) component, "r", represented by envelope signal 112.

The polar transmitter of FIG. 3 further includes high sample rate digital-to-analog converters (DACs) 120 and 122, low pass filters (LPFs) 130 and 132, a two-point modulated PLL 140, a power amplifier (PA) 150 and antenna 86. The two-point modulated PLL 140 includes two inputs 142 and 144, each coupled to receive the phase signal 114.

In an exemplary operation of the polar transmitter, the digital envelope signal 112 output from polar converter 110 is input to high sample rate DAC 120, followed by LPF 130 to produce an analog envelope signal. The digital phase signal 114 output from polar converter 110 is input to high sample rate DAC 122, followed by LPF 132 to filter out any digital images to produce a phase-modulated analog signal that is provided to input 144 of the two-point modulated PLL 140. In addition, the digital phase signal 114 is also provided to input 142 of the two-point modulated PLL 140. Thus, both the phase-modulated analog signal and the digital phase signal enter the two-point modulated PLL 140, and collectively operate to enable the phase of the RF output carrier produced by the PLL 140 to track the phase of the phase signal 114.

More specifically, within the PLL 140, the phase-modulated analog signal received at input 144 is provided along a first signal path of the PLL 140 to produce a first frequency modulation signal, and the digital phase signal 114 received at input 142 is provided along a second signal path to produce a second frequency modulation signal, in which the first and second frequency modulation signals are produced by differentiation of the phase signal 114. Each frequency modulation signal is received at a corresponding modulation point of the PLL 140, such that an aggregate of the first frequency modulation signal and the second frequency modulation signal operates to up-convert the phase signal 114 from an intermediate frequency (IF) to a radio frequency (RF) to produce an RF signal. The RF output carrier is modulated in the PA 150 by the analog envelope signal to produce the modulated RF signal 98 that is transmitted over antenna 86.

In accordance with embodiments of the present invention, the PLL 140 is designed such that the first frequency modulation signal is a narrowband signal, while the second frequency modulation signal is a wideband signal, the combination of which produces a wideband RF signal at the output of the PLL. Thus, with a PLL 140 so designed, the phase of the RF output signal tracks the phase of the phase signal 114, as desired, and the bandwidth of the RF output signal is effectively "widened" as compared to conventional PLL's used in polar transmitters.

Figure 4:
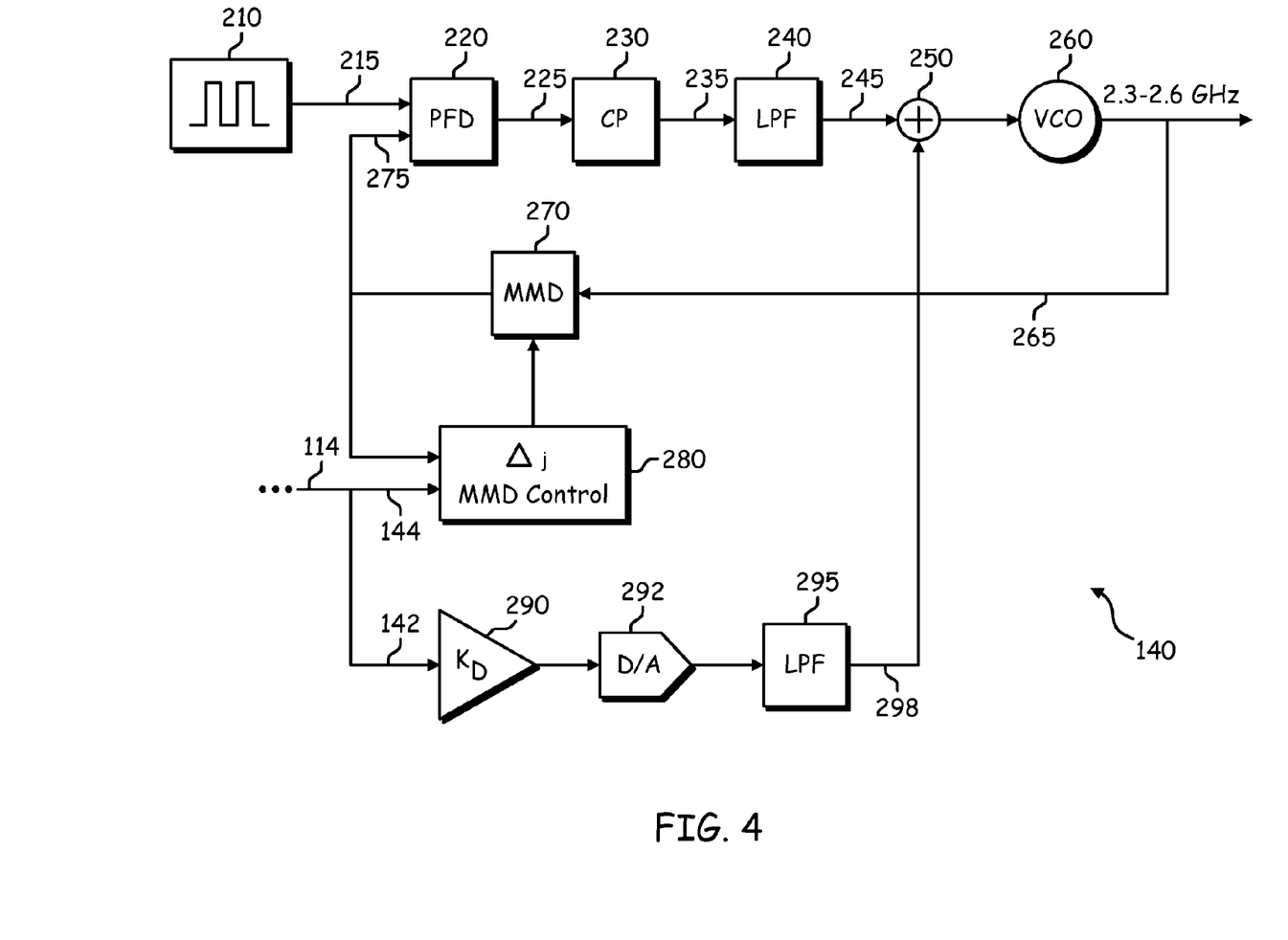
FIG. 4 is a schematic block diagram of an exemplary phase-locked loop (PLL) for use in a polar RF transmitter, in accordance with embodiments of the present invention.

FIG. 4 is a functional block diagram of an exemplary two-point modulation PLL 140 in accordance with embodiments of the present invention. The two-point modulation PLL 140 includes inputs 142 and 144 for receiving the phase signal 114. As described above, the phase signal 114 received at input 144 is provided along a first signal path, whereas the phase signal 114 received at input 142 is provided along a second signal path.

The first signal path includes a ΔΣ MMD controller 280, a multi-modulus divider (MMD) 270, a phase frequency detector (PFD) 220, a charge pump (CP) 230 and a low pass filter (LPF) 240. ΔΣ MMD controller 280 is coupled to receive the phase signal 114 at input 144 and generates divider control signals to the MMD 270 based upon the phase signal 114 received at input 144. The MMD 270 is coupled to receive the divider control signals from the ΔΣ MMD controller 280 and is operable to produce a feedback signal 275 based on the divider control signals. The PFD 220 is coupled to receive a precise reference signal 215 from a crystal oscillator 210 for comparing with the feedback signal 275 to produce an error signal 225 indicative of a phase or frequency difference between the reference signal 215 and the feedback signal 275. The CP 230 produces current pulses 235 based upon the error signal 225, and provides the current pulses to LPF 240. LPF 240 is a narrow filter that produces a narrowband frequency modulation signal 245 from the current pulses.

The second signal path includes a digital gain ($K_D$) 290, a digital-to-analog converter (DAC) 295 and low pass filter 295. The digital phase signal 114 received at input 142 is provided to the digital gain 290 to produce a digital gain signal. The digital gain signal is converted from the digital domain to the analog domain by DAC 295 to produce an analog gain signal for input to LPF 295. LPF 295 is a wideband filter that produces a wideband frequency modulation signal 298 from the DAC analog output signal.

The two-point modulation PLL 140 further includes a summation node 250 and a voltage controlled oscillator (VCO) 260. The summation node 250 is coupled to receive the narrowband frequency modulation signal 245 from LPF 240 and the wideband frequency modulation signal 298 from LPF 295. The frequency modulation signals 245 and 298 each represent control voltages that can be used to control the oscillation of the VCO 260. In particular, summing node 250 combines control voltage 245 and control voltage 298 to produce an aggregate control voltage that is provided to the VCO 260. Thus, summation node 250 provides two modulation points to the VCO 260 and uses the aggregate of the modulation points to control the VCO 260.

Therefore, VCO 260 produces an oscillation 265 based on the aggregate control voltage, and inputs the oscillation 265 to a programmable divider, such as the MMD 270, to produce the feedback signal 275 that is provided to the PFD 220. As described above, MMD 270 sets the divider ratio based upon a divider control signal received from the ΔΣ MMD controller 280, and ΔΣ MMD controller 280 generates the divider control signal based upon the phase signal 114 received at input 144.

In a properly designed PLL, the feedback loop properties of the PLL 140 results in the VCO output 265 "locking" to a frequency equal to the product of crystal oscillator reference frequency 215 and the divider ratio of the MMD 270. Thus, the closed loop tracking action causes the error signal 225 to approach zero, and therefore, the phase of the RF output carrier 265 tracks the phase of the input phase signal 114, as desired.

By using two VCO modulation points, and thus two signal paths for the phase signal 114, the bandwidth of the VCO output 265 can be effectively "widened" as compared to conventional PLL's that include only a single modulation point and a single signal path. To realize the effective bandwidth widening of the VCO output 265 due the additional signal path, one can examine the transfer functions of each signal path and the combined transfer function of the PLL 140.

Figure 5A:
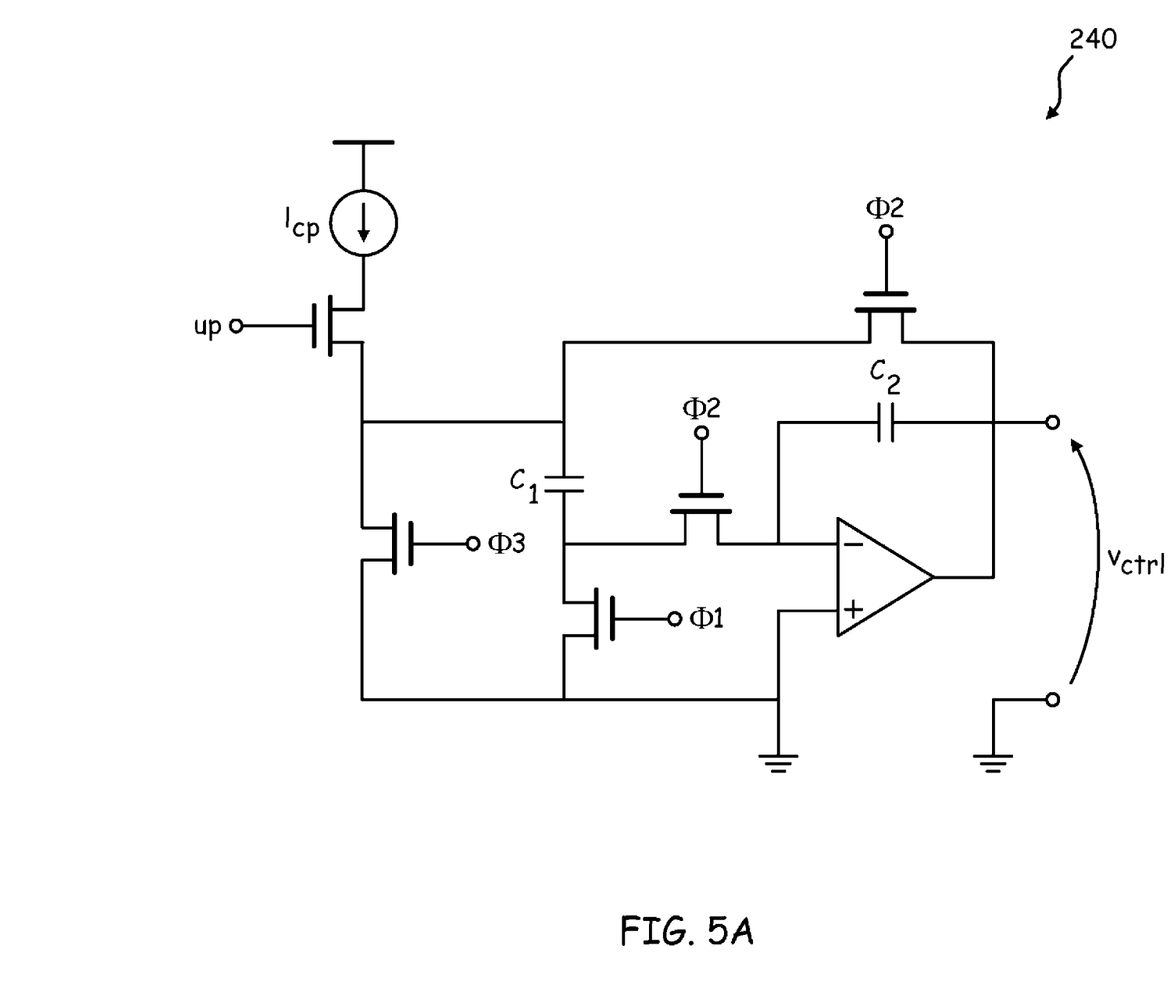
FIG. 5A is a schematic block diagram of an exemplary loop filter (LPF) for use in a PLL of a polar RF transmitter, in accordance with embodiments of the present invention.

The transfer function of the first signal path, herein denoted $H_1(s)$, from input 144 to the output of the VCO 260, can be expressed in terms of charge pump current $i_{CP}$, components of LPF 240, and the sensitivity of the VCO 260 to changes in the control voltage (known as the VCO gain, denoted $K_{VCO}$). The transfer function of the second signal path, herein denoted $H_2(s)$, from input 142 to the output of the VCO 260, can be expressed in terms of the digital gain $K_D$ and the VCO gain $K_{VCO}$. More particularly, employing the example loop filter (LPF) 240 of FIG. 5A, the transfer functions $H_1(s)$ and $H_2(s)$ can be expressed as:

$$H_1(s) = \frac{F_{REF} \times K_{PD} \times K_{VCO} \times \omega_{3dB}}{s^2 + s\omega_{3dB} + \omega_{3dB} \times K_{PD} \times K_{VCO}/N_{TOT}} \quad (2)$$

$$H_2(s) = \frac{K_D \times (s^2 K_{VCO} + s\omega_{3dB} \times K_{VCO})}{s^2 + s\omega_{3dB} + \omega_{3dB} \times K_{PD} \times K_{VCO}/N_{TOT}}$$

where $F_{REF}$ is the reference frequency of the precise crystal oscillator 210, $K_{PD}$ is equal to the product of the charge pump current $i_{CP}$ and the period of the reference frequency $F_{REF}$ divided by the capacitance C1 of the LPF 240 and $N_{TOT}$ is the dividend in the feedback path.

Ideally, it would be desirable that $H_1(s)=1$, such that the phase of the IF phase signal 114 equals the phase of the RF output signal 265 for all frequencies. However, in practice, designing the PLL 140 such that $H_1(s)=1$, i.e., has infinite bandwidth, is not possible. For example, it can be shown that loop stability considerations dictate that the bandwidth of $H_1(s)$ be less than about $\frac{1}{10}$ of the IF signal. Narrowing the bandwidth reduces the amount of "feed-through" of the IF reference signal to the RF output signal. Reference feed-through is the result of several PLL component non-idealities, such as non-zero reset delay of the PFD 220 as well as mismatches between the "up" and "down" current sources of the charge pump 230. These non-ideal effects create a periodic signal on the VCO control voltage 245 corresponding to the reference frequency, and are thus translated to the RF signal as spurious emissions. Typically, in a high-speed digital CMOS process, the reset delay of the PFD 220 is a few nano seconds, and the mismatch of the charge pump 230 current sources is 5-10%.

Thus, as shown in FIG. 4, the bandwidth of the first signal path is reduced by employing the narrowband LPF 240 (i.e., a filter with a bandwidth between 150-200 kHz) in the first signal path. However, in order to increase the effective bandwidth of the VCO output 265, thereby accommodating various communication standards, such as Bluetooth EDR, the bandwidth of the second signal path is made wider than that of the first signal path by employing the wideband LPF 295 (i.e., a filter with a bandwidth of several MHz) in the second signal path.

Due to the low-pass characteristic of the first signal path and the high-pass characteristic of the second signal path as determined by the bandwidths of LPFs 240 and 295, respectively, $H_1(s)$ can be represented as a conventional low-pass transfer function, whereas $H_2(s)$ can be represented as a high-pass transfer function. Thus, to find the DC gain of $H_1(s)$ and the high frequency gain of $H_2(s)$, one determines the limits:

$$H_1(s) = \frac{F_{REF} \times K_{PD} \times K_{VCO} \times \omega_{3dB}}{s^2 + s\omega_{3dB} + \omega_{3dB} \times K_{PD} \times K_{VCO}/N_{TOT}}\bigg|_{s \to 0} \to F_{REF} \quad (3)$$

$$H_2(s) = \frac{K_D \times (s^2 K_{VCO} + s\omega_{3dB} \times K_{VCO})}{s^2 + s\omega_{3dB} + \omega_{3dB} \times K_{PD} \times K_{VCO}/N_{TOT}}\bigg|_{s \to \infty} \to K_D \times K_{VCO}.$$

Thus, it follows that, if:

$$K = K_D \times K_{VCO} = F_{REF}, \quad (4)$$

then:

$$H_1(s) = \frac{K \times F(s)}{1 + F(s)} \quad H_2(s) = \frac{K}{1 + F(s)}, \quad (5)$$

where F(s) is a polynomial. Hence, the aggregate of the two transfer functions, $H_1(s)$ and $H_2(s)$ can be represented as the following all-pass transfer function:

$$H_1(s) + H_2(s) = \frac{K \times F(s)}{1 + F(s)} + \frac{K}{1 + F(s)} = K. \quad (6)$$

In practice, the bandwidth of the sum of $H_1(s)$ and $H_2(s)$ is limited by the bandwidth of the DAC 292 and LPF 295 on the second signal path. However, the bandwidth of the LPF 295 on the second signal path can be made much wider than the bandwidth of the LPF 240 on the first signal path, as described above. Therefore, the effective bandwidth of the VCO output 265 can be made wide (e.g., more than one MHz), depending on the bandwidth of the LPF 295.

Figure 5B:
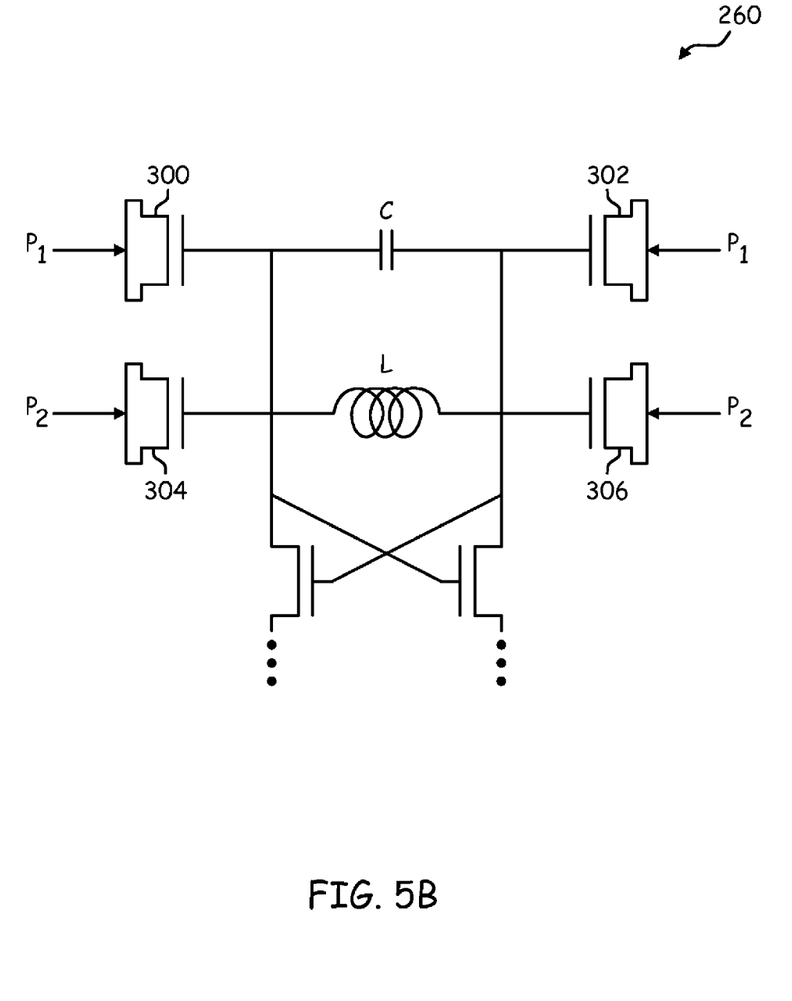
FIG. 5B is a schematic block diagram of an exemplary voltage controlled oscillator for use in a PLL of a polar RF transmitter, in accordance with embodiments of the present invention.

FIG. 5B is a schematic block diagram of an exemplary voltage controlled oscillator (VCO) 260 for use in the two-point modulation PLL, in accordance with embodiments of the present invention. The VCO 260 includes a first pair of varactors 300 and 302 and a second pair of varactors 304 and 306. Each pair of varactors serves as a modulation point to the VCO 260. For example, varactors 300 and 302 serve as a first modulation point P1, while varactors 304 and 306 serve as a second modulation point P2. Thus, the summation node shown in FIG. 4 can be implemented by the two varactor pairs shown in FIG. 5B. By varying the voltage on P1 and P2, the LC network of the VCO 260 oscillates at different frequencies. In one embodiment, varactors 300 and 302 are identical to varactors 304 and 306 such that a voltage change at either modulation point P1 or P2 causes the same change in the oscillation frequency of the VCO. However, in other embodiments, varactor pairs 300/302 and 304/306 may vary by a scaling factor such that the same voltage change at either P1 or P2 causes respective changes in the oscillation frequency of the VCO 260 that differ proportional to the scaling factor.

Figure 6:
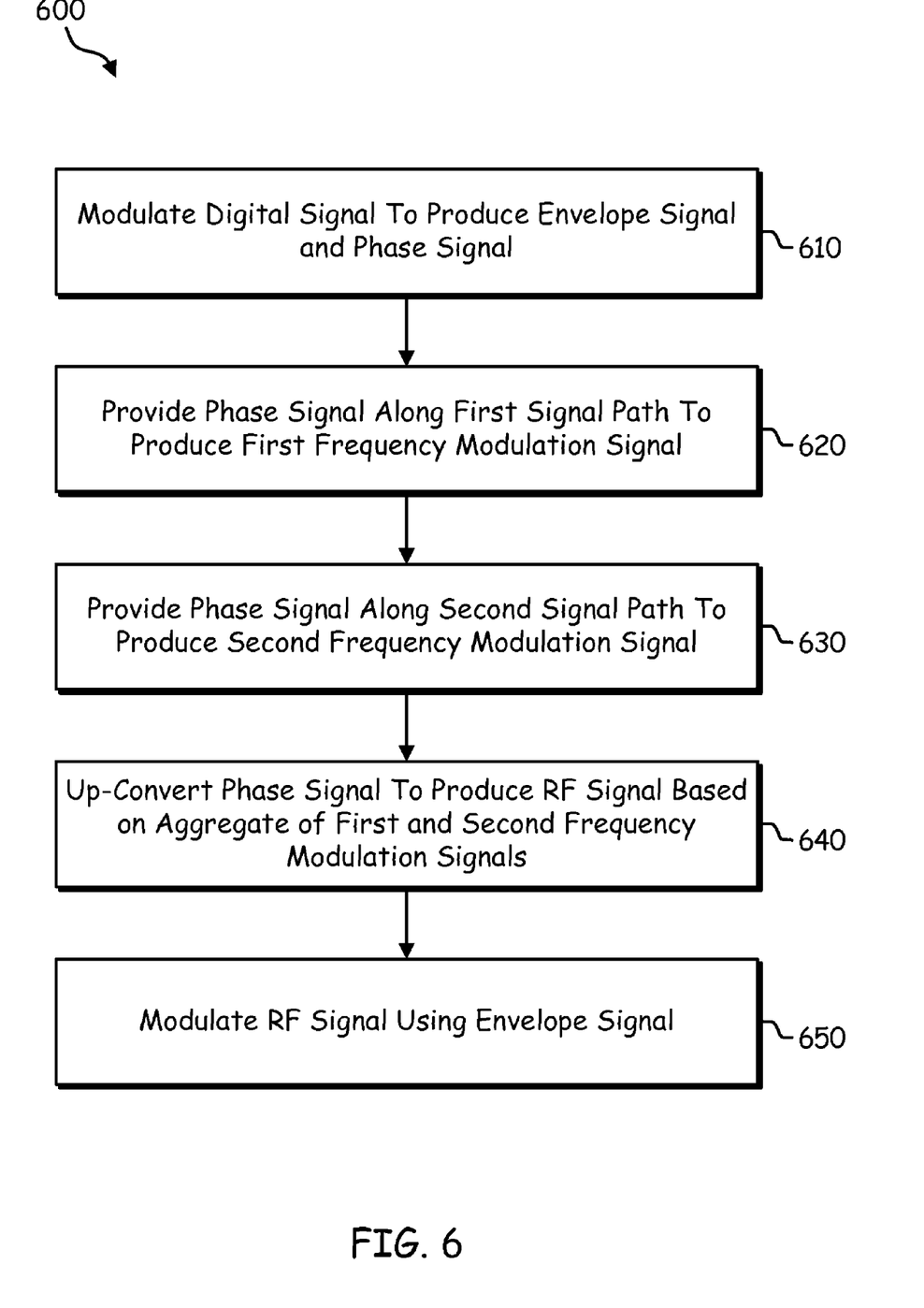
FIG. 6 is a flowchart illustrating one method in accordance with embodiments of the present invention.

FIG. 6 is a flowchart illustrating one method 600 in accordance with embodiments of the present invention. The method begins at step 610, where a digital signal is modulated in a digital modulator to produce a variable-envelope modulated signal including both an envelope signal and a phase signal. At steps 620 and 630, the phase signal of the variable-envelope modulated signal is provided along both a first signal path of a two-point modulated PLL to produce a first frequency modulation signal and a second signal path of the two-point modulated PLL to produce a second frequency modulation signal. The first and second frequency modulation signals are produced by differentiation of the phase signal within the PLL.

The method continues at step 640, where the phase signal of the variable-envelope modulated signal is up-converted from an intermediate frequency (IF) to a radio frequency (RF) within the two-point modulated PLL based on an aggregate of the first frequency modulation signal and the second frequency modulation signal. Finally, at step 650, the RF signal is modulated in a power amplifier using the envelope signal to produce a modulated RF signal for transmission over an antenna.

Turning again to FIG. 3, in practice, the power spectrum emitted from such a polar transmitter will not be ideal due to various imperfections in the RF transmitter circuitry. For example, imperfections in the RF circuitry may result in poor spectral mask performance and/or excessive error vector magnitude (EVM). Each communication standard provides spectral mask requirements and a maximum EVM for a transmitter to qualify for use in that standard. The spectral mask requirements represent the maximum allowable levels of the power spectrum as a function of frequency offset from the RF carrier. In other words, the spectral mask requirements limit the amount of transmitter signal leakage into other users' signal spectrum. The EVM is a measure of the difference between the actual transmitter output and an ideal reference signal.

Using a standard SRC pulse shaping filter 104 with the two-point modulated PLL 140 of the polar transmitter shown in FIG. 3 may result in an RF output signal with large spectral sidelobes, causing marginal spectral mask performance even under ideal circumstances. In addition, using a standard PSK symbol mapper 102 with the two-point modulated PLL 140 of the polar transmitter shown in FIG. 3 may cause small amplitude levels to be clipped or distorted by the PA 150, resulting in unacceptable spectral re-growth or unacceptably large EVM. In order to maintain a small EVM (e.g., less than 1%), while suppressing sidelobes in the RF output signal, modifications may need to be made to the symbol mapper 102 and pulse shaping filter 104.

Figure 7:
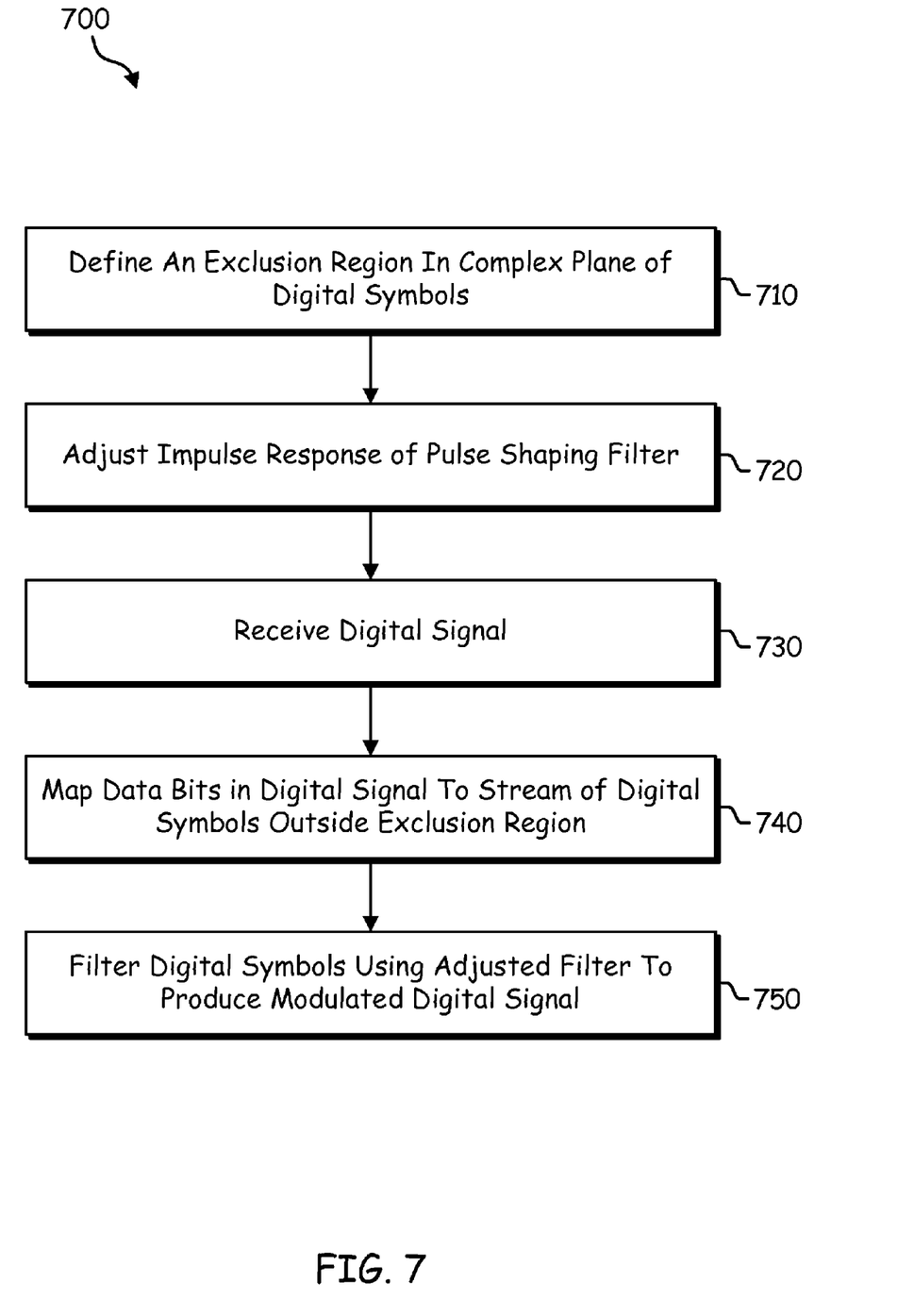
FIG. 7 is a flowchart illustrating a further method in accordance with embodiments of the present invention.
Figure 8:
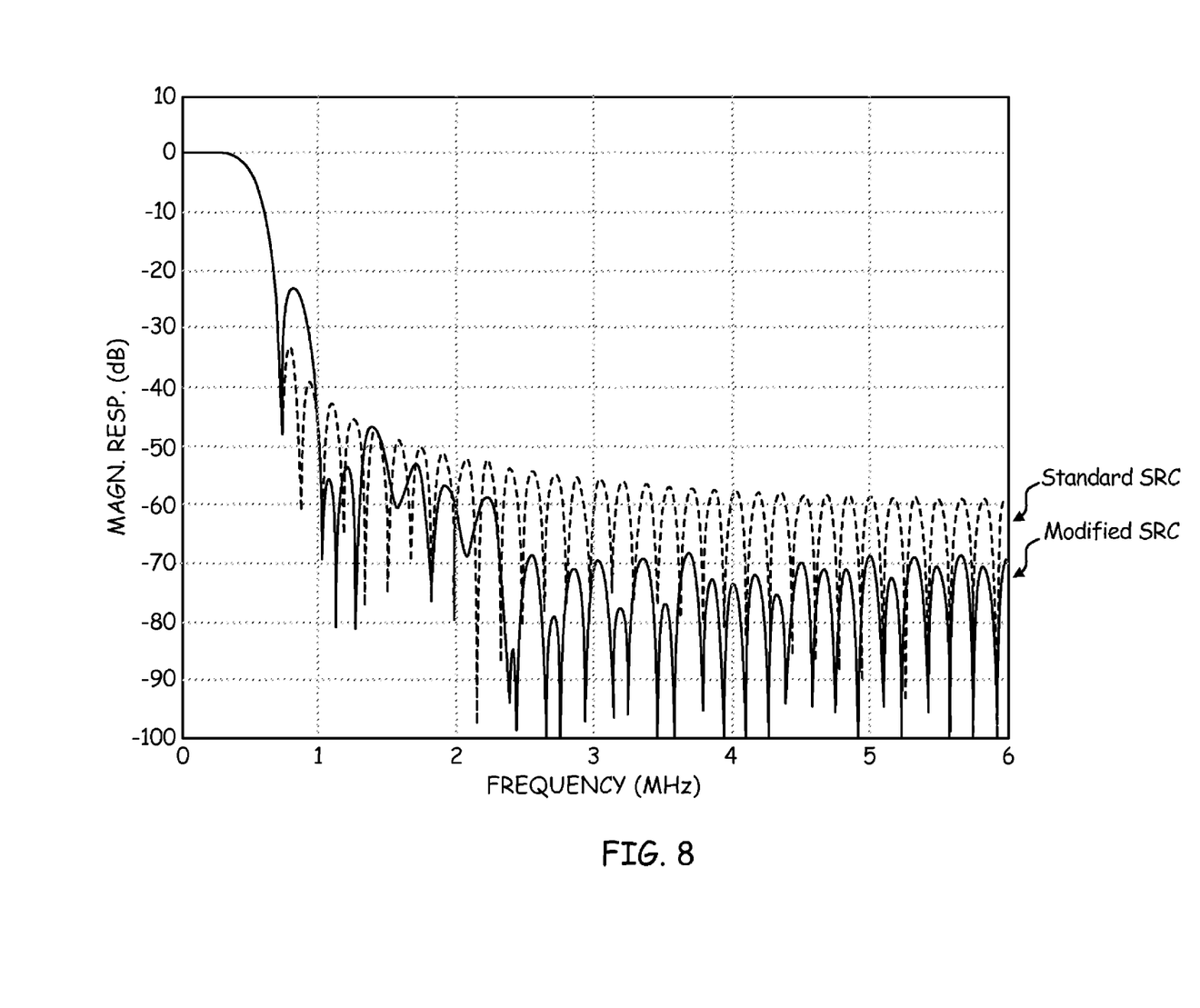
FIG. 8 is a graph illustrating the frequency response of a pulse shaping filter for use in a polar RF transmitter, in accordance with embodiments of the present invention.

FIG. 7 is a flowchart illustrating an exemplary method 700 for modifying the symbol mapper 102 and pulse shaping filter 104 of FIG. 3 to reduce the EVM and suppress sidelobes, in accordance with embodiments of the present invention. The method shown in FIG. 7 will be described with reference to FIGS. 8 and 9. FIG. 8 is a graph illustrating the frequency response of the pulse shaping filter, while FIG. 9 is a schematic representation of the operation of a symbol mapper, in accordance with embodiments of the present invention.

The method begins at step 710, where an exclusion region is defined in the symbol mapper around a zero-crossing of a complex plane representing digital symbols. For example, as can be seen in FIG. 9, a symbol constellation 400 is defined, including a number of constellation points 410, each representing a particular digital symbol. To avoid zero-crossings of the complex plane, and thereby improve performance of the power amplifier in the transmitter, an exclusion region 450 is also defined within the symbol constellation 400. The exclusion region 450 represents a region within the complex plane through which symbol trajectories are not able to pass.

Figure 9:
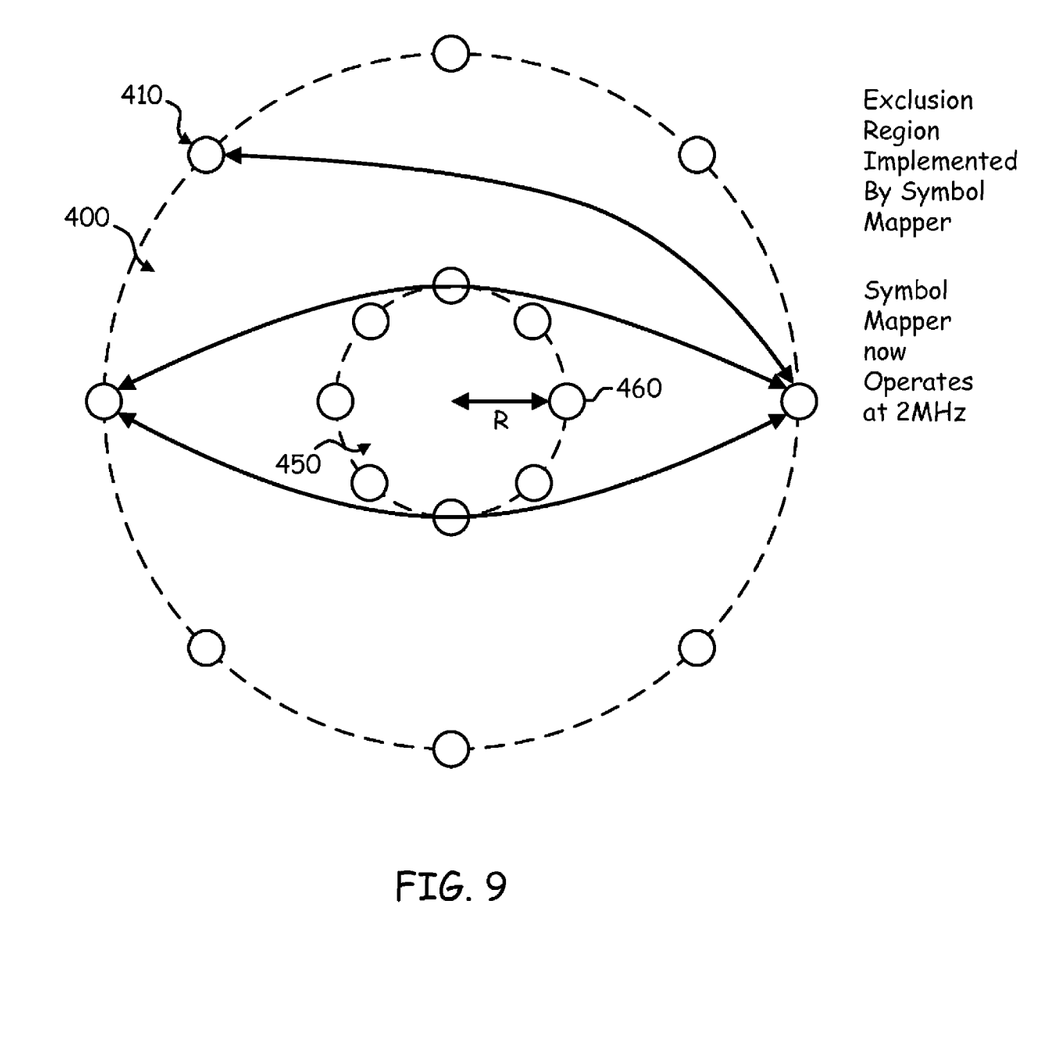
FIG. 9 is a schematic representation of the operation of a symbol mapper for use in a polar RF transmitter, in accordance with an embodiment of the present invention.

As can be seen in FIG. 9, the exclusion region 450 is defined by a number of additional constellation points 460 around the zero-crossing of the complex plane. The constellation points 460 are chosen to produce an exclusion region 450 with a radius R. The radius R can be varied to fine-tune the exclusion region 450 to reduce signal distortion.

In an exemplary operation, as the digital signal transitions between digital symbols, the corresponding trajectory in the complex plane moves between digital symbols 410 in the original symbol constellation 400 such that the trajectory avoids passing through the exclusion region 450. In one embodiment, avoiding the exclusion region 450 is achieved by passing through one of the constellation points 460 defined on the exclusion region constellation. For example, to transition from a digital symbol on one side of the symbol constellation 400 to a digital symbol on the opposite side of the symbol constellation 400, the trajectory passes through an appropriate one of the constellation points 460 defining the exclusion region 450.

Returning now to FIG. 7, once the exclusion region has been defined at step 710, an impulse response of the pulse shaping filter is adjusted at step 720 to suppress sidelobes in the modulated digital signal output from the pulse shaping filter. For example, as can be seen in FIG. 8, an exemplary frequency response of the pulse shaping filter using a modified SRC produces reduced sidelobes as compared to an exemplary frequency response of the pulse shaping filter using a standard (unmodified) SRC in the frequency range of 0-6 MHz.

Referring again to FIG. 7, once the exclusion region has been defined at step 710 and the pulse shaping filter has been modified at step 720, the method then continues at step 730, where an outbound digital signal is received at the symbol mapper. At step 740, the symbol mapper maps data bits within the digital signal to a stream of digital symbols outside of the exclusion region to form in-phase and quadrature symbols. Finally, at step 750, the in-phase and quadrature symbols are input to the modified pulse shaping filter to suppress sidelobes in the in-phase and quadrature signals.

Turning again to FIG. 4, ignoring $K_{VCO}$ variation, the all-pass characteristic of the two-point modulated PLL 140 is insensitive to the exact nature of F(s) (i.e., PLL component variations can be tolerated as long as loop stability and phase noise requirements are not jeopardized). However, the all-pass characteristic may be lost when there is gain mismatch between the two modulation points (i.e., $K_D \times K_{VCO} \neq F_{REF}$). In an exemplary implementation embodiment, the gain mismatch is preferably limited to 5% to satisfy modulation accuracy requirements. In order to limit the gain mismatch to 5%, a calibration procedure of the two-point modulation PLL is performed to substantially match the two gains, $K_D$ and $K_{VCO}$.

Figure 10:
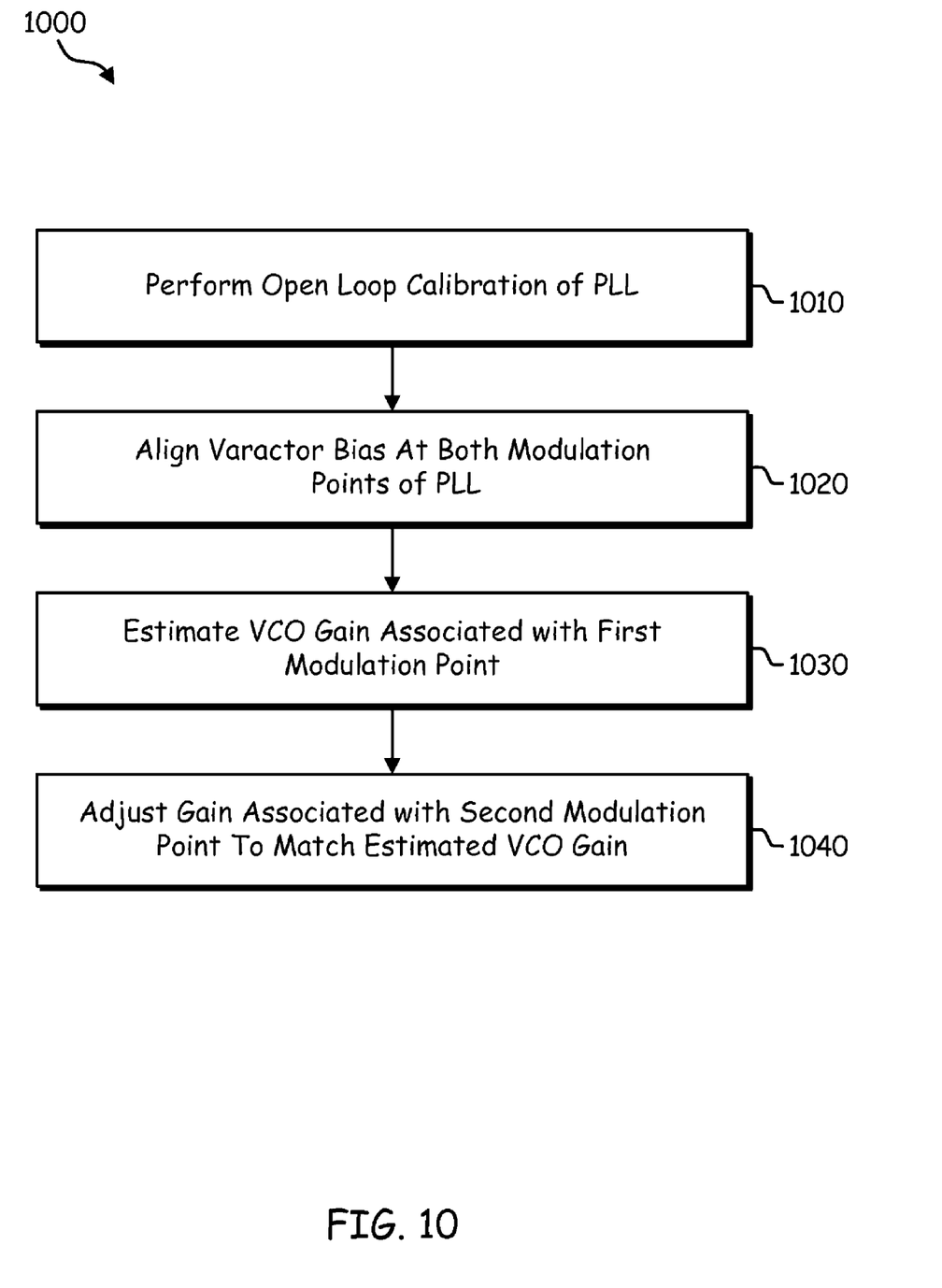
FIG. 10 is a flow chart illustrating yet another method in accordance with embodiments of the present invention.

FIG. 10 is a flow chart illustrating a method 1000 for calibrating the two-point modulated PLL, in accordance with embodiments of the present invention. In a practical setting, the VCO typically undergoes "calibration" as part of the operating the PLL. This calibration sets the approximate operating point of the VCO and allows the VCO to function over a wide range of frequencies. The VCO is typically calibrated for every channel hop. This calibration process involves a sequence of switching in and out of capacitors that tune the operation frequency of the VCO. Typically, calibration of a PLL occurs in two stages. Initially, at step 1010, an open loop stage serves to place the output oscillation with an approximate deviation of a desired frequency of oscillation. The open loop stage is then followed by a closed loop stage at steps 1020-1040 that locks the oscillation to a desired frequency of oscillation.

As shown in FIG. 10, the closed loop calibration stage begins at step 1020, where the varactor bias of the two modulation points of the PLL is aligned. Referring to the VCO structure shown in FIG. 5B, in step 1020, the DC bias present at the varactor pair 300 and 302 corresponding to modulation point P1 is aligned with the DC bias present at the varactor pair 304 and 306 corresponding to modulation point P2. Forcing the DC bias at the two modulation points P1 and P2 to be substantially equal ensures that the VCO gain $K_{VCO}$ seen on each of the two modulation points is also substantially equal. In one embodiment, the varactors bias alignment may be performed by executing the following algorithm:

```
BEGIN
    V_{p2, 1} = VDD/2
    For j = 1..N
        Measure V_{ctrl, j} and calculate D_j = (V_{ctrl, j} - V_{p2, j})/2
        Change V_{p2} according to V_{p2, j+1} = V_{p2, j} + Dj
        Let V_{ctrl} settle
    End
END
```

Here, N is an appropriately chosen (small) integer value which determines the number of iteration steps in the alignment procedure.

The closed loop calibration stage then continues at step 1030, where the VCO gain $K_{VCO}$ is estimated. In one embodiment, the VCO gain is estimated by measuring the steady state control voltage change in response to a known frequency step for positive and negative steps around the VCO settling point, and then calculating the VCO gain as the average of the control voltage changes. The VCO gain ($K_{VCO, EST}$) may be estimated by executing the following algorithm:

```
BEGIN
    Apply step Δ_f/F_ref at H_1(s)
    Let V_ctrl settle.
    Measure control voltage change Δ_Vctrl, 1
    Apply step -Δ_f/F_ref at H_1(s)
    Let V_ctrl settle.
    Measure control voltage change Δ_Vctrl, 2
    K_VCO, EST = [(Δf/-Δ_Vctrl, 1) + (Δf/Δ_Vctrl, 2)]/2
    Let ΔV_1 = -Δ_Vctrl, 1 - Δ_Vctrl, 2
END
```

As discussed above, after varactor bias alignment at step 1020, the VCO gain characteristic is substantially identical on both modulation points. Thus, after VCO gain estimation at step 1030, the gain associated with the second modulation point $K_D$ can be adjusted at step 1040 to match the gains $K_D$ and $K_{VCO}$ to within 5%, thereby aligning the gains at the two modulation points. In one embodiment, to adjust the gain of $K_D$, relatively accurate negative and positive steps matching the negative and positive steps imposed on $H_1(s)$ during step 1030 can now be imposed on $H_2(s)$ at step 1040, i.e., $$\Delta_2 = \pm \frac{\Delta_f}{K_D \times K_{VCO,EST}} \quad (7)$$

Thereafter, the total change in control voltage, $\Delta V_2$, is measured and the ratio between $\Delta V_1$ and $\Delta V_2$ can be calculated as a direct measure of the modulation point gain error, $E_{MOD}$, as follows:

$$\frac{\Delta V_1}{\Delta V_2} = E_{DAC} \times E_{VCO} \equiv E_{MOD}. \quad (8)$$

The digital gain $K_D$ can then be adjusted according to:

$$K_D = \frac{F_{REF}}{K_{VCO,EST}} \times E_{MOD}, \quad (9)$$

whereafter, the modulation point gains are aligned. It should be noted that this process is typically in-sensitive to any ADC and/or DAC errors.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A two-point modulation phase-locked loop (PLL) for use in a polar transmitter, comprising:
    a first input coupled to receive a phase signal of a variable-envelope modulated signal and coupled to provide the phase signal along a first signal path to produce a first frequency modulation signal;
    a second input coupled to receive the phase signal and coupled to provide the phase signal along a second signal path to produce a second frequency modulation signal, the first and second frequency modulation signals being produced by differentiation of the phase signal; and
    a voltage controlled oscillator having a first modulation point as a first oscillator input directly coupling the voltage controlled oscillator to the first signal path to receive the first frequency modulation signal and a second modulation point as a second oscillator input directly coupling the voltage controlled oscillator to the second signal path to receive the second frequency modulation signal; and
    a summation node implemented within the voltage controlled oscillator, wherein the summation node comprises:
        a first pair of varactors forming the first modulation point coupled to receive the first frequency modulation signal; and
        a second pair of varactors forming the second modulation point coupled to receive the second frequency modulation signal;
    wherein the voltage controlled oscillator is controlled by an aggregate of the first frequency modulation signal and the second frequency modulation signal to up-convert the phase signal from an intermediate frequency (IF) to a radio frequency (RF) to produce an RF signal;
    wherein the voltage controlled oscillator has a first gain associated with the first modulation point and the second modulation point has a second gain associated therewith, and wherein the second gain is substantially matched to the first gain by adjusting the second gain external to the PLL.

2. The PLL of claim 1, wherein the first signal path comprises:
    a phase and frequency detector coupled to receive a reference signal and a feedback signal and operable to produce an error signal indicative of a difference in phase or frequency between the reference signal and the feedback signal;

a charge pump coupled to receive the error signal and operable to generate a current pulse proportional to the error signal; and a loop filter coupled to receive the current pulse and operable to filter the current pulse to produce a first control voltage as the first frequency modulation signal for input to the first modulation point of the voltage controlled oscillator.

3. The PLL of claim 2, wherein the phase signal received at the second input is a digital phase signal, and wherein the second signal path comprises:

a digital gain coupled to the second input to receive the digital phase signal and operable to produce a digital gain signal;

a Digital-to-Analog converter (DAC) for converting the digital gain signal from digital to analog to produce an analog gain signal; and a low pass filter for filtering the analog gain signal to produce a second control voltage as the second frequency modulation signal.

4. The PLL of claim 3, wherein the voltage controlled oscillator is operable to track the phase of the phase signal based on the first control voltage and the second control voltage to produce the RF signal.

5. The PLL of claim 4, further comprising:

a frequency divider coupled to receive the RF signal and divide the RF signal by a divide ratio to produce the feedback signal; and a controller coupled to the first input to receive the phase signal and operable to set the divide ratio based on the phase signal.

6. The PLL of claim 1, wherein the second gain is matched to the first gain within 5%.

7. A method for calibrating a two-point modulated phase-locked loop (PLL) including a voltage controlled oscillator having a first modulation point as a first input directly thereto and a second modulation point as a second input directly thereto, the first modulation point having a first gain associated therewith and the second modulation point having a second gain associated therewith, the method comprising the steps of:

providing a first pair of varactors within the voltage controlled oscillator forming the first modulation point coupled to receive a first frequency modulation signal; and providing a second pair of varactors within the voltage controlled oscillator forming the second modulation point coupled to receive a second frequency modulation signal;

aligning, external to the PLL, the DC bias of the first modulation point and the second modulation point to produce aligned modulation points;

estimating the first gain using the aligned modulation points to produce an estimated first gain; and adjusting the second gain to substantially match the second gain to the first gain by adjusting the second gain external to the PLL.

8. The method of claim 7, further comprising:

performing an open loop calibration of the PLL to place an output oscillation of the PLL with an approximate deviation of a desired frequency of oscillation.

9. The method of claim 7, wherein the step of aligning further includes:

forcing the DC bias present at a first varactor pair input to a voltage controlled oscillator (VCO) corresponding to the first modulation point to be substantially matched to the DC bias present at a second varactor pair input to the VCO corresponding to the second modulation point.

10. The method of claim 9, wherein the step of estimating further includes:

measuring first control voltage changes in response to known frequency steps imposed on the first modulation point for positive and negative steps around a settling point of the VCO; and calculating a gain of the VCO as the average of the first control voltage changes, the gain of the VCO being the first gain.

11. The method of claim 10, wherein the step of adjusting further includes:

determining a first total change in control voltage from the first control voltage changes;

measuring second control voltage changes by imposing negative and positive steps on the second modulation point matching the negative and positive steps imposed on the first modulation point;

measuring a second total change in control voltage from the second control voltage changes;

calculating the ratio between to the first total change in control voltage and the second total change in control voltage produce a modulation point gain error; and adjusting the second gain based on the modulation point gain error.

12. The method of claim 7, wherein the step of adjusting further includes:

adjusting the second gain such that the mismatch between the second gain and the first gain is within 5%.

* * * * *